(12) United States Patent
Liu

(10) Patent No.: US 11,536,778 B2
(45) Date of Patent: Dec. 27, 2022

(54) METHOD AND SYSTEM FOR FAULT VERIFICATION OF ELECTRONIC DEVICE

(71) Applicant: GUANGDONG OPPO MOBILE TELECOMMUNICATIONS CORP., LTD., Guangdong (CN)

(72) Inventor: Nianfeng Liu, Guangdong (CN)

(73) Assignee: GUANGDONG OPPO MOBILE TELECOMMUNICATIONS CORP., LTD., Dongguan (CN)

(*) Notice: Subject to any disclaimer, the term of this patent is extended or adjusted under 35 U.S.C. 154(b) by 247 days.

(21) Appl. No.: 16/842,136

(22) Filed: Apr. 7, 2020

(65) Prior Publication Data
US 2020/0233040 A1    Jul. 23, 2020

Related U.S. Application Data

(63) Continuation of application No. PCT/CN2018/115466, filed on Nov. 14, 2018.

(51) Int. Cl.
  *G01R 31/56* (2020.01)
  *G01R 31/52* (2020.01)
  *G01K 3/06* (2006.01)

(52) U.S. Cl.
  CPC .............. *G01R 31/56* (2020.01); *G01K 3/06* (2013.01); *G01R 31/52* (2020.01)

(58) Field of Classification Search
  CPC ......................... G01R 31/50–71; G01K 5/06
  See application file for complete search history.

(56) References Cited

U.S. PATENT DOCUMENTS

| | | | | |
|---|---|---|---|---|
| 4,906,939 A | * | 3/1990 | Berrigan | G01R 31/016 324/548 |
| 5,990,698 A | * | 11/1999 | Suzuki | G01R 31/261 324/762.01 |

(Continued)

FOREIGN PATENT DOCUMENTS

| | | |
|---|---|---|
| CN | 102017351 A | 4/2011 |
| CN | 202013387 U | 10/2011 |

(Continued)

OTHER PUBLICATIONS

Orlov et al., Intelligent Measuring System for Testing and Failure Analysis of Electronic Devices, Computer Technology Department, 2016. (pp. 401-403).

(Continued)

*Primary Examiner* — Patrick Assouad
*Assistant Examiner* — Demetrius R Pretlow
(74) *Attorney, Agent, or Firm* — Young Basile Hanlon & MacFarlane, P.C.

(57) ABSTRACT

A method and a system for fault verification of an electronic device are provided. The electronic device includes a device to-be-verified. The method includes the following. A first power-supply voltage is applied to the electronic device until the device to-be-verified satisfies a material-failure condition. A second power-supply voltage is applied to the electronic device to determine whether the electronic device has safety risk. The first power-supply voltage is higher than the second power-supply voltage, and the safety risk is caused by material failure in the device to-be-verified. The method and the system for fault verification of an electronic device can verify safety risk caused by material failure in internal components of the electronic device.

20 Claims, 7 Drawing Sheets

(56) References Cited

U.S. PATENT DOCUMENTS

| | | | | |
|---|---|---|---|---|
| 6,489,783 | B1* | 12/2002 | Liu | G01R 31/129 324/663 |
| 8,461,849 | B1* | 6/2013 | Almonte | G01R 31/016 324/548 |
| 8,829,898 | B1* | 9/2014 | Solt | G01R 31/2879 324/762.02 |
| 11,018,623 | B2* | 5/2021 | Loewenstern | H02S 40/34 |
| 2002/0105336 | A1 | 8/2002 | Swale | |
| 2003/0001607 | A1* | 1/2003 | Galyon | G01R 31/2841 324/762.09 |
| 2006/0281338 | A1* | 12/2006 | Chanda | H01L 22/14 438/791 |
| 2007/0115006 | A1* | 5/2007 | Anude | G01R 31/016 324/678 |
| 2008/0143342 | A1 | 6/2008 | Freeman | |
| 2008/0174334 | A1* | 7/2008 | Chanda | G06F 30/20 716/112 |
| 2012/0310849 | A1* | 12/2012 | Huang | G06F 11/24 705/317 |
| 2014/0067303 | A1* | 3/2014 | Millman | G01R 31/016 324/750.05 |
| 2016/0241148 | A1 | 8/2016 | Kizilyalli et al. | |
| 2017/0271897 | A1* | 9/2017 | Wen | H02J 7/007 |
| 2017/0288384 | A1* | 10/2017 | Loewenstern | H02M 7/48 |
| 2018/0080979 | A1* | 3/2018 | Brown | G01R 1/07378 |

FOREIGN PATENT DOCUMENTS

| | | | | |
|---|---|---|---|---|
| CN | 102810122 | A | | 12/2012 |
| CN | 103713255 | A | | 4/2014 |
| CN | 103958261 | A * | 7/2014 | ............. B60L 3/003 |
| CN | 104767260 | A | | 7/2015 |
| CN | 105934868 | A | | 9/2016 |
| CN | 106602535 | A | | 4/2017 |
| CN | 106970309 | A * | 7/2017 | |
| CN | 108196177 | A | | 6/2018 |
| CN | 108288863 | A | | 7/2018 |
| CN | 207798952 | U | | 8/2018 |
| CN | 108535594 | A | | 9/2018 |
| EP | 1360751 | A2 | | 11/2003 |
| EP | 2187227 | A1 | | 5/2010 |

OTHER PUBLICATIONS

Li Weidong, Safety risk analysis of vehicle charger, Guizhou Mechanical and Electronic Product Quality Supervision and Inspection Institute. (6 pages).

Chinese Notice of First Review Opinion with English Translation for CN Application 201880041131.0 dated Jun. 16, 2021. (13 pages).

Extended European Search Report for EP Application 18940284.5 dated Apr. 29, 2021. (7 pages).

Indian Hearing Notice for IN Application 202017014532 dated Mar. 3, 2022. (3 pages).

Communication pursuant to Article 94(3) EPC for EP Application 18940284.5 dated May 23, 2022. (4 pages).

First Examination Report issued in corresponding IN application No. 202017014532 dated Oct. 12, 2020.

ISR issued in corresponding international application No. PCT/CN2018/115466 dated May 29, 2019.

* cited by examiner

METHOD AND SYSTEM FOR FAULT VERIFICATION OF ELECTRONIC DEVICE

CROSS-REFERENCE TO RELATED APPLICATION(S)

This application is a continuation of International Application No. PCT/CN2018/115466, filed on Nov. 14, 2018, the disclosure of which is hereby incorporated by reference in its entirety.

TECHNICAL FIELD

This disclosure relates to the field of electronic technology, and more particularly to a method and a system for fault verification of an electronic device.

BACKGROUND

Fault simulation of a power supply, as a failure simulation method, is a common practice in the industry to verify whether a product has safety risk.

In the related art, fault simulation is mainly focused on open circuit test and short circuit test of devices in the product. However, in practice, failure of the devices in the product is not entirely limited to open circuit or short circuit in many situations, and as a result, the product may still has safety hazard even though the product has passed the open circuit test and the short circuit test.

Therefore, it is necessary to provide a new method and a system for fault verification of an electronic device.

The above information disclosed in the background section is merely for better understanding of the background of the disclosure and therefore may include information that does not constitute the related art known to those of ordinary skill in the art.

SUMMARY

According to a first aspect, a method for fault verification of an electronic device is provided. The electronic device includes a device to-be-verified. The method includes the following. A first power-supply voltage is applied to the electronic device until the device to-be-verified satisfies a material-failure condition. A second power-supply voltage is applied to the electronic device to determine whether the electronic device has safety risk. The first power-supply voltage is higher than the second power-supply voltage, and the safety risk is caused by material failure in the device to-be-verified.

According to a second aspect, a system for fault verification of an electronic device is provided. The system includes an electronic device, a power supply, and a controller. The electronic device includes a device to-be-verified. The power supply is electrically coupled with the electronic device. The controller is configured to control the power supply to apply a first power-supply voltage to the electronic device until a device to-be-verified of the electronic device satisfies a material-failure condition. The controller is further configured to control the power supply to apply a second power-supply voltage to the electronic device to determine whether the electronic device has safety risk. The first power-supply voltage is higher than the second power-supply voltage, and the safety risk is caused by material failure in the device to-be-verified. The electronic device is electrically coupled with the power supply.

According to a third aspect, a non-transitory computer readable storage medium is provided. The non-transitory computer readable storage medium stores programs which, when executed by a computer, are operable with the computer to: control a power supply to apply a first power-supply voltage to an electronic device until a device to-be-verified of the electronic device satisfies a material-failure condition, control the power supply to apply a second power-supply voltage to the electronic device to determine whether the electronic device has safety risk according to at least one of: temperature distribution information, existence of electric arc, or existence of accumulation of electrolyte between a primary coil and a secondary coil of a transformer of the electronic device. The local overheat spot refers to a local area of the electronic device where a temperature remains higher than a threshold temperature for a third preset duration or the temperature increases to be higher than the threshold temperature within a fourth preset duration, the second preset duration is longer than the third preset duration, and the third preset duration is longer than the fourth preset duration

DETAILED DESCRIPTION

Figure 1A:
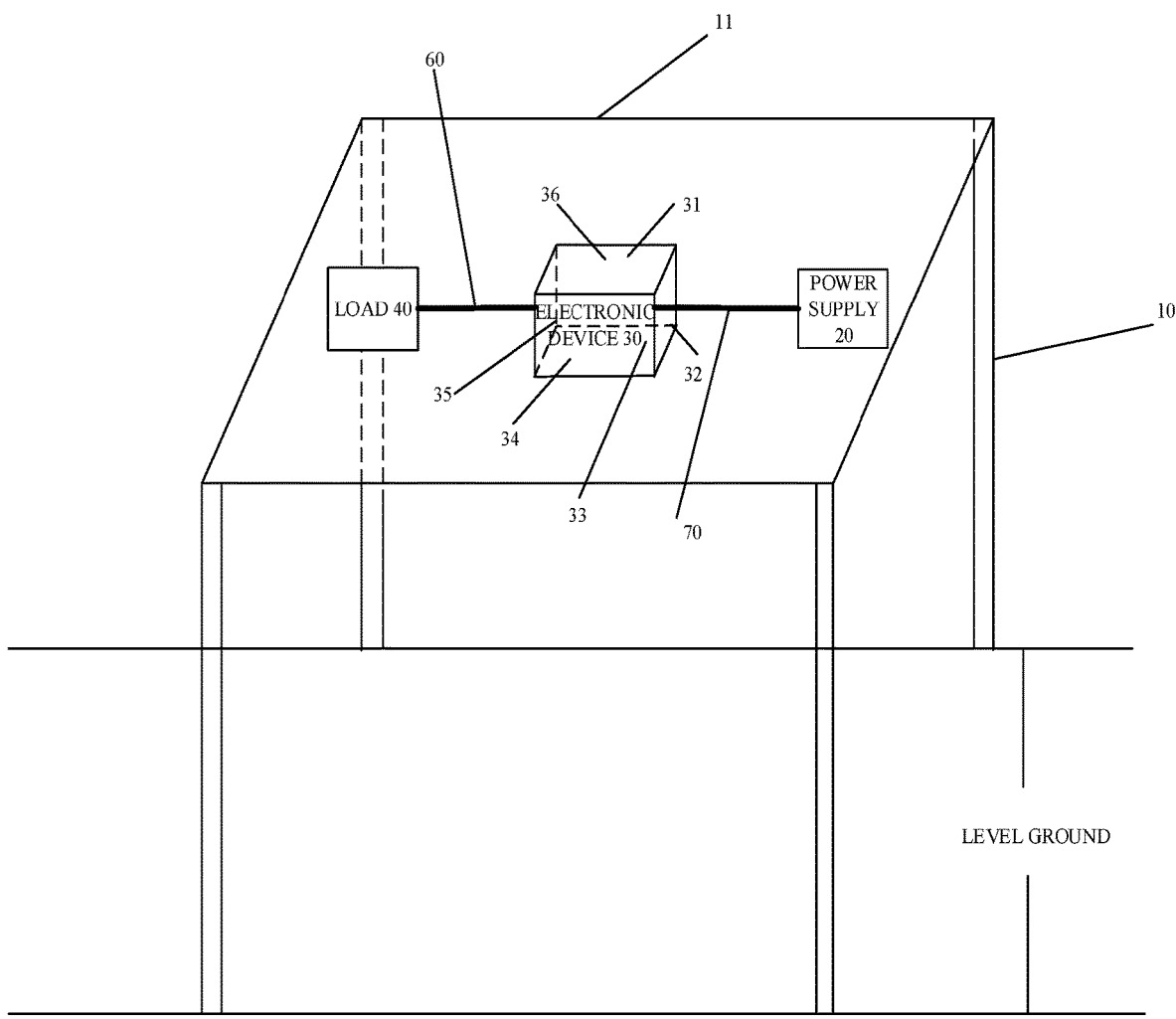
FIG. 1A is an architecture diagram of a system for fault verification of an electronic device according to implementations.

Example implementations will now be described more comprehensively with reference to the accompanying drawings. However, example implementations can be implemented in various forms and should not be construed as being limited to the implementations set forth herein; on the contrary, these implementations are provided so that this disclosure will be comprehensive and complete, and will fully convey the concept of example implementations to those skilled in the art. The same reference numerals in the drawings denote the same or similar parts, and therefore repeated description will be omitted.

In addition, the described features, structures, or characteristics may be combined in any proper manner in one or more implementations. In the following description, numerous specific details are provided to give a full understanding of implementations. However, those skilled in the art will realize that the technical solutions of implementations may be practiced without one or more of the specific details, or other methods, components, devices, steps, etc. may be adopted. In other situations, well-known methods, devices, implementations, or operations have not been illustrated or described in detail to avoid obscuring various aspects of implementations.

The block diagram in the accompanying drawings merely represents functional entities and does not necessarily correspond to physically separated entities. In other words, these functional entities can be implemented in the form of software, or implemented in one or more hardware modules or integrated circuits, or implemented in different networks and/or processor devices and/or microcontroller devices.

The flowchart in the accompanying drawings is only an example description, does not necessarily include all contents and operations/steps, and is not necessarily performed in the order illustrated. For example, some operations/steps can also be decomposed, and some operations/steps can be merged or partially merged. Therefore, the actual execution order may vary according to actual needs.

It should be understood that directional relationship or positional relationship indicated by terms such as "center", "longitudinal", "lateral", "length", "width", "thickness", "on", "under", "front", "back", "left", "right", "vertical", "horizontal", "top", "bottom", "in", "out", "clockwise", "anticlockwise", and the like is directional relationship or positional relationship based on accompanying drawings and is only for the convenience of description and simplicity, rather than explicitly or implicitly indicate that apparatuses or components referred to herein must have a certain orientation or be configured or operated in a certain orientation and therefore should not be comprehended as limitations on implementations.

In addition, terms "first", "second", and the like are only used for description and should not be comprehended as explicitly or implicitly indicating relative importance or implicitly indicating the number of technical features referred to herein. Therefore, features restricted by terms "first", "second", and the like can explicitly or implicitly include at least one of the features. In the context of implementations, unless stated otherwise, "multiple" or "a plurality of" refers to "at least two", such as two, three, and the like.

Unless stated otherwise, in implementations, terms "installing", "coupling", "connecting", "fixing", and the like referred to herein should be interpreted in broader sense. For example, coupling may be a fixed coupling, a removable coupling, or an integrated coupling, may be a mechanical coupling, an electrical coupling or intercommunication, and may be a direct coupling, an indirect coupling through a medium, or internal coupling or interaction between two components. For those of ordinary skill in the art, the above terms in implementations can be understood according to specific situations.

Unless stated otherwise, in implementations, a first feature being "on" or "under" a second feature can refer to the first feature being in direct contact with the second feature or the first feature being in indirect contact with the second feature via another feature therebetween. In addition, the first feature being "above", "over", and "on" the second feature can refers to the first feature being right above or obliquely above the second feature or only refers to the first feature being at a higher horizontal level than the second feature. The first feature being "below", "underneath", and "under" the second feature can be the first feature being right below or obliquely below the second feature or only refers to the first feature being at a lower horizontal level than the second feature.

Those skilled in the art can appreciate that the accompanying drawings are merely schematic diagrams of example implementations. Modules or flows in the accompanying drawings are however not essential to implementing the disclosure and therefore cannot be intended to limit the protection scope of the disclosure.

A system for fault verification of an electronic device is first provided according to implementations. The system includes a power supply and an electronic device. The power supply is configured to apply a first power-supply voltage to the electronic device until a device to-be-verified of the electronic device satisfies a material-failure condition. The power supply is further configured to apply a second power-supply voltage to the electronic device to determine whether the electronic device has safety risk. The first power-supply voltage is higher than the second power-supply voltage, and the safety risk is caused by material failure in the device to-be-verified. The electronic device is electrically coupled with the power supply.

In some implementations, the system further includes a load. The load is configured to be electrically coupled with the electronic device when the power supply applies the second power-supply voltage to the electronic device.

In the following, the system for fault verification of an electronic device will be illustrated with reference to FIG. 1A.

FIG. 1A is an architecture diagram of a system for fault verification of an electronic device according to implementations.

As illustrated in FIG. 1A, a support 10 is placed on the level ground. The support has a horizontal upper surface 11 (that is, an upper surface which is parallel to the level ground) on which a power supply 20, an electronic device 30, and a load 40 are placed.

It is to be noted that, in other examples, the electronic device 30 is not restricted to being placed on the horizontal upper surface 11 of the support 10 which is parallel to the level ground and may be placed on any object that can support the electronic device 30, and description herein is for illustrative purpose only. In addition, the power supply 20, the electronic device 30, and the load 40 are however not required to be placed on the same support 10. Instead, the above three may be placed on different supports or even directly placed on the ground, which is not limited herein.

In the following implementations, the electronic device 30 is a power adaptor, but implementations are not limited thereto.

The power adaptor is configured to charge a battery. The power supply 20 is configured to supply power to the load 40. The load 40 is coupled to the power supply 20 via the power adaptor.

According to implementations, the power adaptor is a charger for a mobile terminal and is configured to convert a 220V alternating current (AC) into a direct current (DC) of a voltage value required. For example, if the mobile terminal is a mobile phone, the power adaptor converts the 220V AC into a 5V DC to be applied to a battery of the mobile phone.

According to implementations, the power adaptor can further include a protective casing, a capacitor, an inductor, a transformer (including a primary coil and a secondary coil), an integrated circuit (IC), a printed circuit board (PCB), and the like.

The load 40 according to implementations can be any one of a mobile phone, a two-way radio, an e-reader, a moving picture experts group audio layer III (MP3) player, a moving picture experts group audio layer IV (MP4) player, a notebook computer, a tablet computer, or the like.

The load 40 can include a charging circuit, a battery, a memory, a display screen, etc.

As illustrated in FIG. 1A, the power supply 20 is electrically coupled with the electronic device 30 via a first data line 70. The electronic device 30 is electrically coupled with the load 40 via a second data line 60.

The first data line 70 can have a first connection end and a second connection end, where the first connection end is coupled with the power supply 20, and the second connection end is coupled with the electronic device 30. The electronic device 30 can include a connection interface. The connection interface is adapted to the second connection end. For example, the connection interface is a universal serial bus (USB) Type-A female connector, and the second connection end is a USB Type-A male connector. The second data line 60 can have a third connection end and a fourth connection end, where the third connection end is coupled with the electronic device 30, and the fourth connection end is coupled with the load 40. The load 40 can include a charging interface. The charging interface is adapted to the fourth connection end. For example, the fourth connection end is a Micro USB Type-B male connector, and the charging interface is a Micro USB Type-B female connector.

It is to be noted that, a connection interface of the power adaptor is generally a female connector and may be a USB Type A interface or a USB Type B interface, where the USB Type A interface is commonly used. The charging interface may be a Micro USB interface, a USB Type C interface, or a Lightning interface.

As illustrated in FIG. 1A, the electronic device 30 has six faces (also known as "sides" or "side faces"), for example, a first face 31 (that is, an upper surface), a second face 32 (that is, a right face), a third face 33 (that is, a front face), a fourth face 34 (that is, a bottom face), a fifth face 35 (that is, a left face), and a sixth face 36 (that is, a back face).

According to implementations, the electronic device 30 can be placed in various placement manners. Take a power adaptor with the above six faces as an example, the first face 31, the second face 32, the third face 33, the fourth face 34, the fifth face 35, and the sixth face 36 are respectively in contact with the horizontal upper surface 11 of the support 10, and as such, a first placement manner, a second placement manner, a third placement manner, a fourth placement manner, a fifth placement manner, and a sixth placement manner of the power adaptor are respectively determined.

It is to be noted that, the placement manner of the power adaptor is however not limited to the six placement manners listed above. For example, any one of the edges of the power adaptor can be in contact with the horizontal upper surface 11 of the support 10. In this situation, the power adaptor can be fixed to the support with other aid tools.

In implementations illustrated in FIG. 1A, if the fourth face 34 is in contact with the horizontal upper surface 11 of the support 10, the electronic device 30 is determined to be in the fourth placement manner.

Figure 1B:
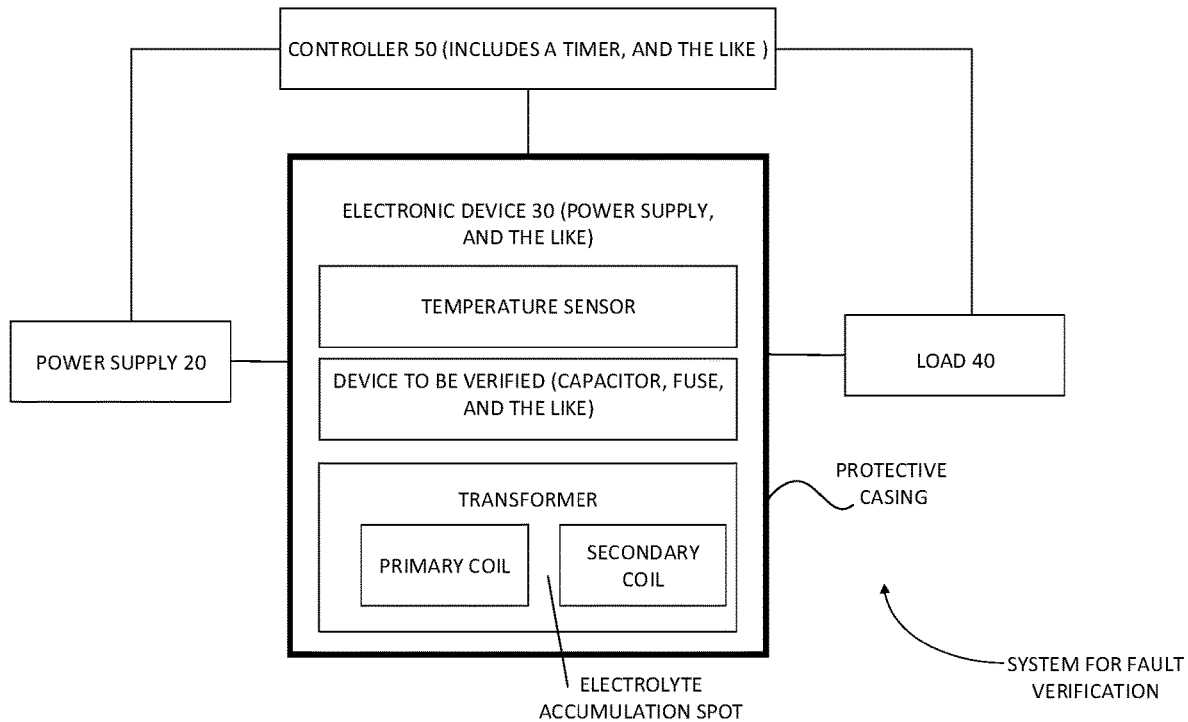
FIG. 1B is a structural diagram of a system for fault verification of an electronic device according to implementations.

FIG. 1B is a structure diagram illustrating a system for fault verification of an electronic device according to implementations. As illustrated in FIG. 1B, the system may further include a controller 50 for controlling the fault verification process. The controller 50 is illustrated as separated from the electronic device for ease of explanation; alternatively, it can be inside and as part of the electronic device.

The controller 50 is coupled with the electronic device 30 and the power supply 20 and configured to: control the power supply to apply a first power-supply voltage to the electronic device until the device to-be-verified satisfies a material-failure condition, and control the power supply to apply a second power-supply voltage to the electronic device to determine whether the electronic device has safety risk, where the first power-supply voltage is higher than the second power-supply voltage, and the safety risk is caused by material failure in the device to-be-verified.

As illustrated in FIG. 1B, the electronic device 30 further includes a protective casing. Here, in terms of controlling the power supply to apply the second power-supply voltage to the electronic device, the controller is configured to: control the power supply to apply, within a first preset duration which has elapsed after the device to-be-verified satisfies the material-failure condition, the second power-supply voltage to the electronic device to make the electronic device work normally for a second preset duration, wherein the first preset duration is shorter than the second preset duration. The controller is further configured to: obtain temperature distribution information of the electronic device; and determine, according to the temperature distribution information, whether the electronic device has the safety risk, wherein the safety risk refers to casing melting. Specifically, the controller is configured to: determine, according to the temperature distribution information, existence of at least one local overheat spot in the electronic device, and determine that the at least one local overheat spot has the risk of casing melting upon determining that the at least one overheat spot exists in the electronic device.

The temperature distribution information can be obtained through a temperature sensor provided in the electronic device. Once the temperature inside the electronic device is detected, the controller can obtain or receive the temperature distribution information from the temperature sensor, and then determine whether there is any local overheat spot in the electronic device.

The local overheat spot refers to a local area of the electronic device where a temperature remains higher than a threshold temperature for a third preset duration or the temperature increases to be higher than the threshold temperature within a fourth preset duration, the second preset duration is longer than the third preset duration, and the third preset duration is longer than the fourth preset duration.

To monitor the first preset duration and the second preset duration, a timer can be provided in the system. For instance, the timer can be located inside the electrical device. Alternatively, the timer can be integrated with the controller, as illustrated in FIG. 1B.

As further illustrated in FIG. 1B, the device to-be-verified is a capacitor, the material-failure condition is that electrolyte in the capacitor is ejected out. The electronic device 30 further includes a transformer, and the transformer includes a primary coil and a secondary coil. The controller 50 is further configured to: determine existence of at least one electrolyte accumulation spot between the primary coil and the secondary coil; detect a touch current between the primary coil and the secondary coil upon determining that the at least one electrolyte accumulation spot exists between the primary coil and the secondary coil; determine that the electronic device has the safety risk in response to the touch current being larger than a threshold current, wherein the safety risk refers to electrical leakage.

In other implementations, the controller is further configured to: determine existence of at least one arc spot in the electronic device, determine that the at least one arc spot has the safety risk upon determining that the at least one arc spot exists in the electronic device, wherein the safety risk refers to energy safety.

Figure 2:
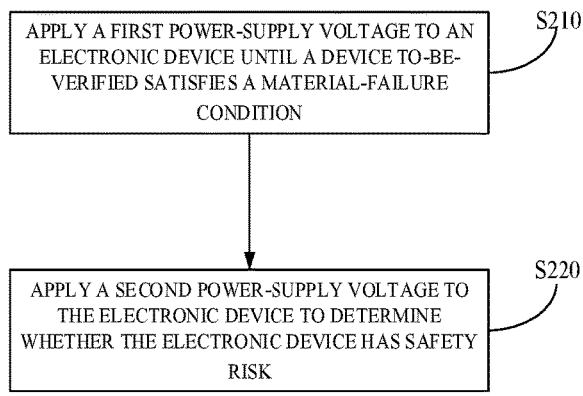
FIG. 2 is a flowchart of a method for fault verification of an electronic device according to implementations.

FIG. 2 is a flowchart of a method for fault verification of an electronic device according to implementations. The electronic device includes a device to-be-verified. The device to-be-verified may include, for example, one or more of a capacitor, a fuse, etc. In the following implementations, the device to-be-verified is the capacitor. For devices other than the capacitor, the method for fault verification is similar to that of the capacitor.

As illustrated in FIG. 2, the method includes the following. In one implementation, the method is performed under control of a controller such as the controller 50 illustrated in FIG. 1B.

At block S210, a first power-supply voltage is applied to the electronic device until the device to-be-verified satisfies a material-failure condition.

According to implementations, the first power-supply voltage of high voltage (for example, a normal working voltage is 220V (volt), and the first power-supply voltage can be 380V or even higher) can be inputted into a power adaptor by three-phase mains electricity or an over 10,000 W power supply, to simulate material failure of the capacitor of the power adaptor, that is, to make the capacitor experience blast due to high voltage and make electrolyte in the capacitor be ejected out.

It is to be noted that, the first power-supply voltage of high voltage applied to the capacitor is a forward voltage rather than a reverse voltage. The reason is that if the reverse voltage is applied to the capacitor, although the capacitor will bulge, the electrolyte in the capacitor will not be ejected out.

Three-phase AC is a form of transmission of electrical energy, which is referred to as three-phase mains electricity. A three-phase AC power supply is composed of three AC potentials which have the same frequency and amplitude and any two of which have a 120° (degree) phase difference.

At block S220, a second power-supply voltage is applied to the electronic device to determine whether the electronic device has safety risk.

The first power-supply voltage is higher than the second power-supply voltage. The safety risk is caused by material failure in the device to-be-verified.

In some implementations, the first power-supply voltage is higher than or equal to 380V.

In some implementations, the second power-supply voltage is 220V.

In some implementations, the first power-supply voltage and the second power-supply voltage are provided by the three-phase mains electricity or the over 10,000 W power supply. However, implementations are not limited thereto, and the first power-supply voltage and the second power-supply voltage may be provided by different power supplies.

According to implementations, when material failure occurs to devices in the power adaptor, some metal, liquid, or gas produced will spill into internal space of the power adaptor, or flow onto other devices that have not experienced material failure (that is, normal devices), or flow onto a protective casing of the power adaptor. If liquid which has been ejected out flows onto the protective casing of the power adaptor, the local area of the protective casing onto which the liquid flows will experience overtemperature, and the temperature of the local area is likely to exceed the melting point of the protective casing, which results in risk of casing melting of the protective casing. If the liquid which has been ejected out flows onto other normal devices, such device can also experience failure, that is, chain failures can occur. On the other hand, an open circuit in normal situations in the electronic device can become a path, which in turn results in energy safety risk, that is, a previous open circuit becomes a path, which results in multiple times of arc (or referred to as electric arc, ignition, and the like) and thus pushes away the protective casing of the power adaptor due to excessively high energy. In the above situations, the safety risk exists while the electronic device is not completely in an open-circuit state or a short-circuit state and meanwhile, some impedance exists in the electronic device. Accordingly, the electronic device can be comprehended as being in an intermediate state. However, in the intermediate state, the electronic device still has safety risk or defects compared with the electronic device in a normal working state. By adopting the technical solution of implementations herein, safety risk when the electronic device is in the intermediate state caused by material failure of devices can be found in advance.

In the following, implementations will be described in further detail in connection with FIG. 3 to FIG. 7.

Compared with foregoing implementations, a placement manner of the electronic device on a support is determined in advance before the first power-supply voltage is applied to the electronic device.

According to implementations, multiple placement manners corresponding to the power adaptor can be simulated and verified. The reason is that different placement manners may lead to different results of fault simulation and verification.

For example, orientations of the six faces of the power adaptor relative to the ground can be changed, where the orientations are described relative to the ground. In fault simulation and verification, the six faces of the power adaptor respectively face the ground. Due to effect of gravity, electrolyte which is ejected out because of capacitor failure will flow onto different positions, which in turn affects verification result.

In some implementations, the electronic device has six faces, and the placement manner includes six placement manners, where in each of the six placement manners, the electronic device respectively has one of the six faces in contact with a horizontal upper surface of the support.

Figure 3:
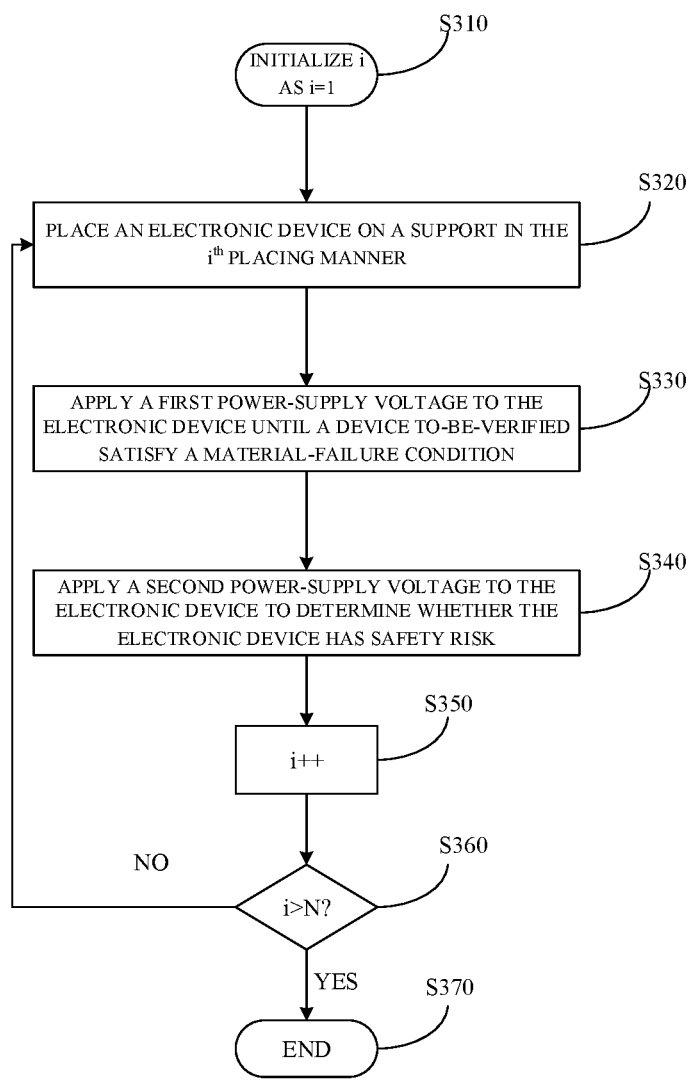
FIG. 3 is a flowchart of a method for fault verification of an electronic device according to other implementations.

FIG. 3 is a flowchart of a method for fault verification of an electronic device according to other implementations. As illustrated in FIG. 3, the method includes the following.

At block S310, initialize i as i=1, where i represents the $i^{th}$ placement manner of the electronic device, and i is a positive integer and $1 \le i \le N$, N represents the number of preset placement manners of the electronic device, and N=6 in the implementations given above.

At block S320, place the electronic device on a support in the $i^{th}$ placement manner.

At block S330, apply a first power-supply voltage to the electronic device until a device to-be-verified satisfies a material-failure condition.

At block S340, apply a second power-supply voltage to the electronic device to determine whether the electronic device has safety risk.

For operations at block S330 and S340, reference can be made to operations at block S210 and S220 of foregoing implementations, which will not be described in detail herein.

At block S350, i++, that is, increase i progressively by 1.

At block S360, determine whether i obtained at block S350 is greater than N. If i>N, proceed to operations at block S370. Otherwise, return to operations at block S320 and perform repeatedly operations at block S320 to block S360.

At block S370, end.

In some implementations, the electronic device further includes a protective casing, and the safety risk includes risk of casing melting. The second power-supply voltage is applied to the electronic device to determine whether the electronic device has safety risk as follows. The electronic device is electrically coupled with a load. The second power-supply voltage is applied to the electronic device within a first preset duration which has elapsed after the device to-be-verified satisfies the material-failure condition, to make the electronic device work normally for a second preset duration, where the first preset duration is shorter than the second preset duration. Temperature distribution information of the electronic device is obtained. Whether the electronic device has the risk of casing melting is determined according to the temperature distribution information.

In some implementations, whether the electronic device has the risk of casing melting is determined according to the temperature distribution information as follows. Whether at least one local overheat spot exists in the electronic device is determined according to the temperature distribution information. Upon determining that the at least one overheat spot exists in the electronic device, determine that the at least one local overheat spot has the risk of casing melting.

In some implementations, the local overheat spot refers to a local area of the electronic device with the following characteristics. In the local area, a temperature remains higher than a threshold temperature (for example, 120° C., but implementations are not limited thereto) for a third preset duration (for example, 1 min (minute), but implementations are not limited thereto and the third preset duration can be determined according to practical situations). Alternatively, in the local area, the temperature increases to be higher than the threshold temperature within a fourth preset duration (for example, 1 s (second), but implementations are not limited thereto and the fourth preset duration can be determined according to practical situations).

According to implementations, the second preset duration is longer than the third preset duration, and the third preset duration is longer than the fourth preset duration.

In some implementations, the threshold temperature is associated with a melting point of the protective casing.

In the following, implementations will be described in further detail in connection with FIG. 4 and FIG. 5.

Figure 4:
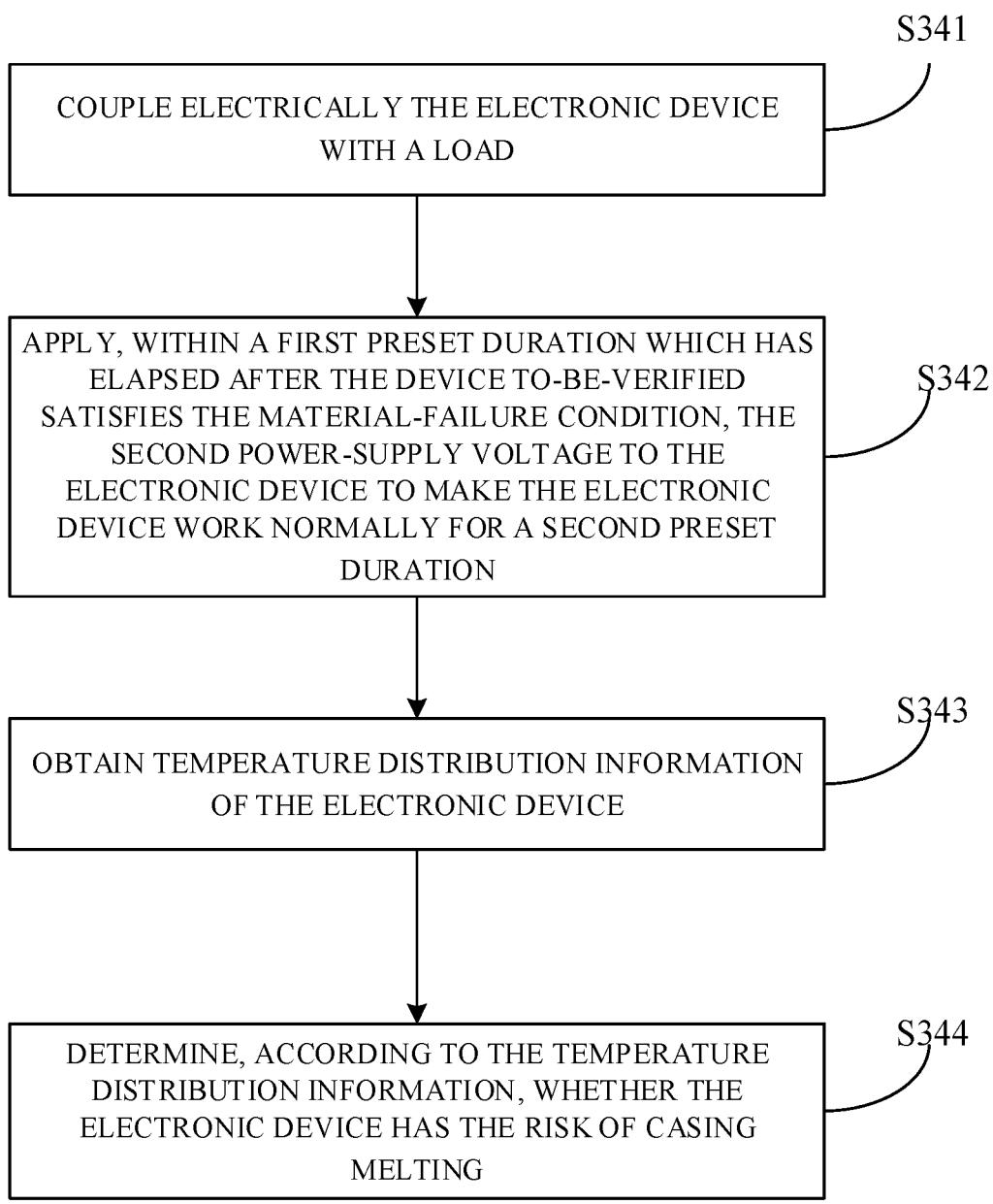
FIG. 4 is a flowchart of an example implementation of operations at block S340 illustrated in FIG. 3.

FIG. 4 is a flowchart of an example implementation of operations at block S340 illustrated in FIG. 3.

As illustrated in FIG. 4, operations at block S340 according to implementations include the following.

At block S341, the electronic device is electrically coupled with the load.

According to implementations, if the electronic device is implemented as the power adaptor, the load is implemented as a mobile terminal such as a mobile phone.

At block S342, the second power-supply voltage is applied to the electronic device within the first preset duration which has elapsed after the device to-be-verified satisfies the material-failure condition, to make the electronic device work normally for the second preset duration.

According to implementations, the first power-supply voltage of 380V is first applied to the power adaptor until a capacitor of the power adaptor experiences material failure and electrolyte in the capacitor is ejected out, and then the normal second power-supply voltage of 220V is immediately (that is, the first preset duration can be set to be very short such as 1 s) applied to the power adaptor, to make the power adaptor work normally for a long time (the second preset duration can be determined according to practical situations).

It is to be noted that, according to implementations, when the first power-supply voltage of high voltage is applied to the electronic device, the load may or may not be coupled with the electronic device.

At block S343, the temperature distribution information of the electronic device is obtained.

According to implementations, the temperature distribution information of the electronic device can be acquired by a thermal imager, but implementations are not limited thereto.

At block S345, whether the electronic device has the risk of casing melting is determined according to the temperature distribution information.

According to implementations, when the capacitor of the power adaptor fails, the electrolyte in the capacitor will be ejected out. When a fuse of the power adaptor experiences failure, black conductive substances in the fuse will be ejected out. The above two types of material failure are both likely to lead to local overheat of the protective casing of the power adaptor after the power adaptor works normally for a long time. In other words, a local area onto which the electrolyte or the conductive substances flow may experience overtemperature, which results in casing melting of the power adaptor, that is, the power adaptor has the risk of casing melting.

Figure 5:
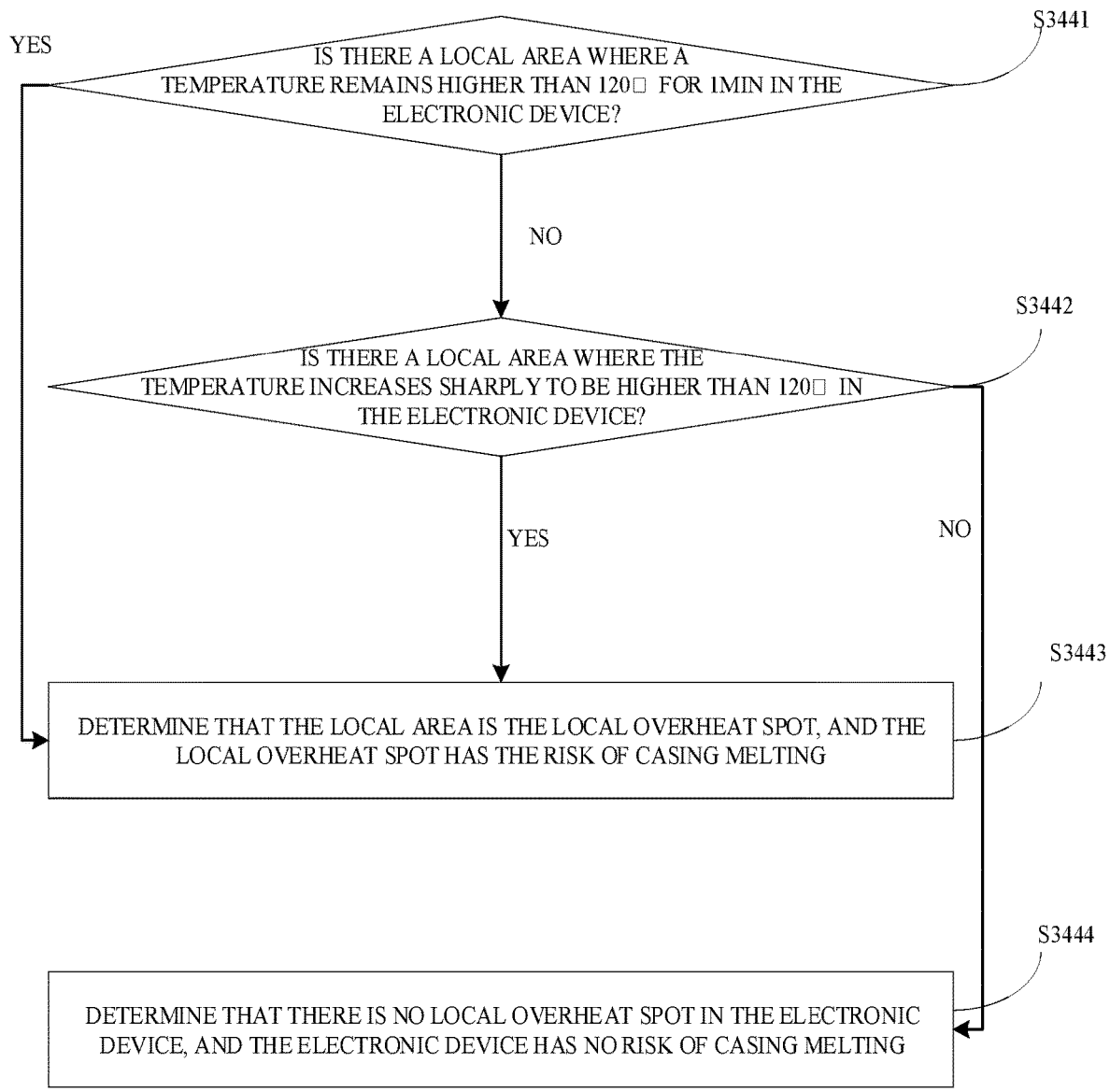
FIG. 5 is a flowchart of an example implementation of operations at block S344 illustrated in FIG. 4.

FIG. 5 is a flowchart of an example implementation of operations at block S344 illustrated in FIG. 4.

As illustrated in FIG. 5, operations at block S344 according to implementations include the following.

At block S3441, determine whether there is a local area where a temperature remains higher than 120° C. for 1 min in the electronic device. If yes, proceed to operations at block S3443. Otherwise, proceed to operations at block S3442.

It is to be noted that, the "1 min" and "120° C." referred to herein are used for illustrative purpose rather than limiting the protection scope of the disclosure.

At block S3442, determine whether a local area where the temperature increases sharply to be higher than 120° C. exists in the electronic device. If yes, proceed to operations at block S3443. Otherwise, proceed to operations at block S3444.

According to implementations, the protective casing of the power adaptor may be made of plastic or wood. It can be understood that, the protective casing may also be made of other insulating materials such as plastic cement. Generally, a melting point of the protective casing of the power adaptor is 125° C., and therefore the temperature threshold is set to be 120° C. However, the temperature threshold can be adjusted according to different material of the protective casing of the electronic device.

At block S3443, determine that the local area is the local overheat spot, and the local overheat spot has the risk of casing melting.

At block S3444, determine that there is no local overheat spot in the electronic device, and the electronic device has no risk of casing melting.

In some implementations, the device to-be-verified includes a capacitor, and the material-failure condition is that electrolyte in the capacitor is ejected out, which will be illustrated in connection with implementations of FIG. 6.

In some implementations, the device to-be-verified includes a fuse, and the material-failure condition is that conductive substances in the fuse are ejected out. It is to be noted that, although implementations of FIG. 6 are described by taking the capacitor as an example, in practice, capacitor failure and fuse failure may be verified at the same time during one fault simulation and verification.

Figure 6:
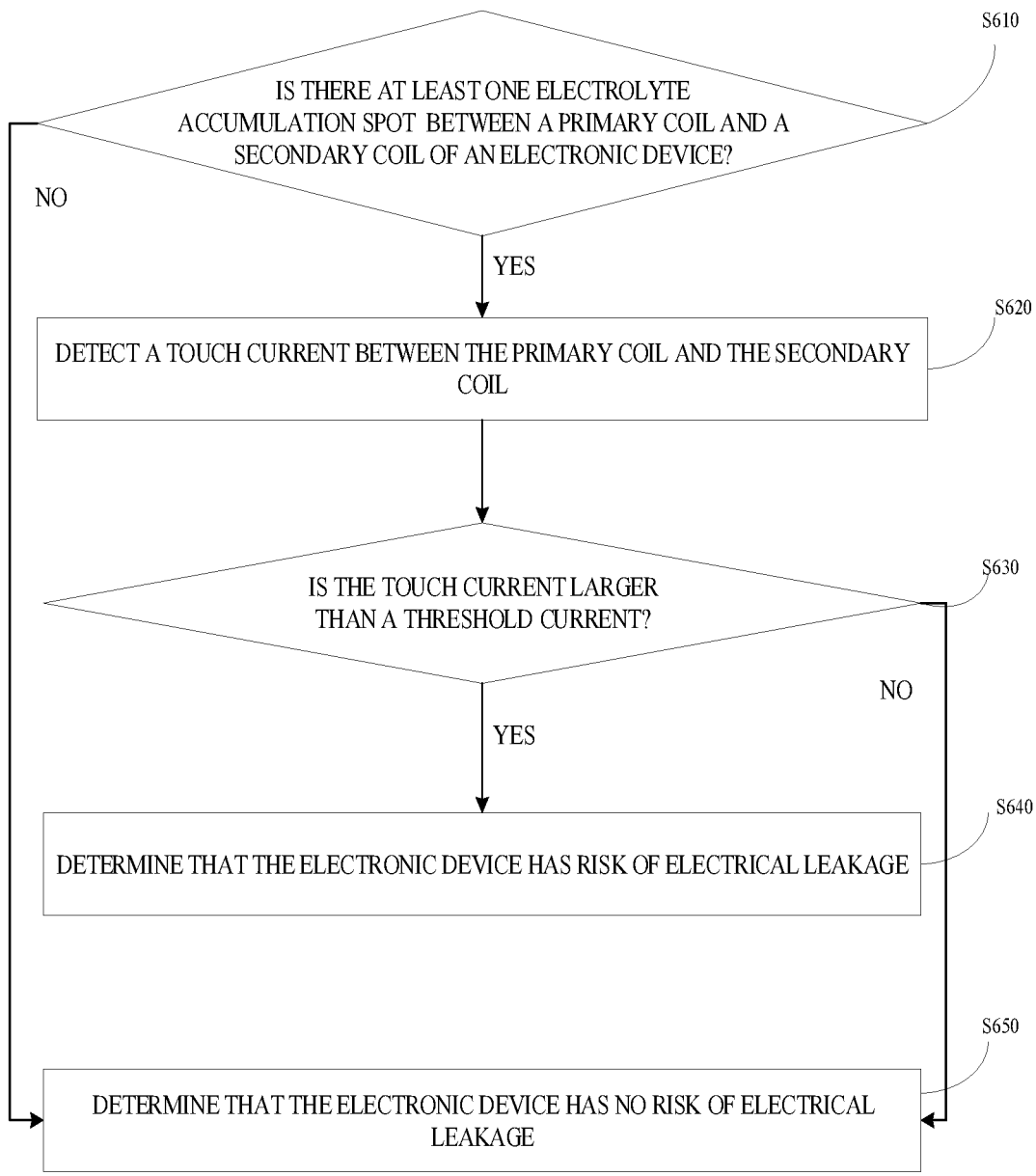
FIG. 6 is a flowchart of a method for fault verification of an electronic device according to other implementations.

FIG. 6 is a flowchart of a method for fault verification of an electronic device according to other implementations.

According to implementations, the electronic device includes a transformer. The transformer includes a primary coil and a secondary coil.

The transformer is configured to change AC voltage based on principles of electromagnetic induction and mainly includes the primary coil, the secondary coil, and an iron core. A coil has two or more windings, where the winding coupled with a power supply is referred to as the primary coil and other winding(s) are referred to as the secondary coil(s).

The difference between the method illustrated in FIG. 6 and the method in the foregoing implementations lies in that the method illustrated in FIG. 6 further includes the following.

At block S610, determine existence of at least one electrolyte accumulation spot between the primary coil and the secondary coil of the electronic device. If yes, proceed to operations at block S620. If not, proceed to operations at block S650.

According to implementations, when the capacitor fails and the electrolyte is ejected out, the electrolyte is likely to flow to a position between the primary coil and the secondary coil, which leads to electrical leakage between the primary coil and the secondary coil.

As an example, a casing of a product (such as the power adaptor) which has been subjected to high-voltage fault (such as 380V) simulation can be opened to observe directly whether electrolyte accumulation exists between the primary coil (a high-voltage area) and the secondary coil (a low-voltage area). If yes, the at least one electrolyte accumulation spot is considered to exist. If only a thin layer of electrolyte exists between the primary coil and the secondary coil, determine that there is no electrolyte accumulation spot.

As another example, whether the at least one electrolyte accumulation spot exists between the primary coil and the secondary coil is determined through image recognition.

For instance, an interior image of the power adaptor prior to high-voltage fault simulation can be collected with an image sensor, and then an interior image of the power adaptor which has been subjected to high-voltage fault simulation can be collected. The above two images collected are compared to determine whether there is any electrolyte accumulation spot between the primary coil and the secondary coil. Alternatively, the interior image of the power adaptor which has been subjected to high-voltage fault simulation can be directly collected to determine, through image recognition, whether there is any electrolyte accumulation spot between the primary coil and the secondary coil.

At block S620, a touch current between the primary coil and the secondary coil is detected.

At block S630, whether the touch current is larger than a threshold current is determined. If yes, proceed to operations at block S640. If not, proceed to operations at block S650.

At block S640, determine that the electronic device has risk of electrical leakage.

At block S650, determine that the electronic device has no risk of electrical leakage.

According to the standard for the power adaptor, the touch current between the primary coil and the secondary coil of the power adaptor is normally required to be smaller than 0.25 mA (milliampere) (that is, 250 µA (microampere)). If the touch current detected is larger than 0.25 mA, determine that the electronic device has the risk of electrical leakage.

It is to be noted that, when the electronic device is other types of electronic devices, the threshold current can be set according to specific application scenarios, which is not limited herein.

It is to be noted that, if the power adaptor is a mobile phone charger, the mobile phone charger will normally convert, through the primary coil and the secondary coil, a 220V AC into a low voltage DC of 5V or 10V to be applied to a battery of a mobile phone. However, when the mobile phone charger has the risk of electrical leakage, the mobile phone charger is likely to apply directly the 220V AC to the battery of the mobile phone, which results in a series of safety risks such as damage, explosion, burst into fire, etc. of the mobile phone.

Figure 7:
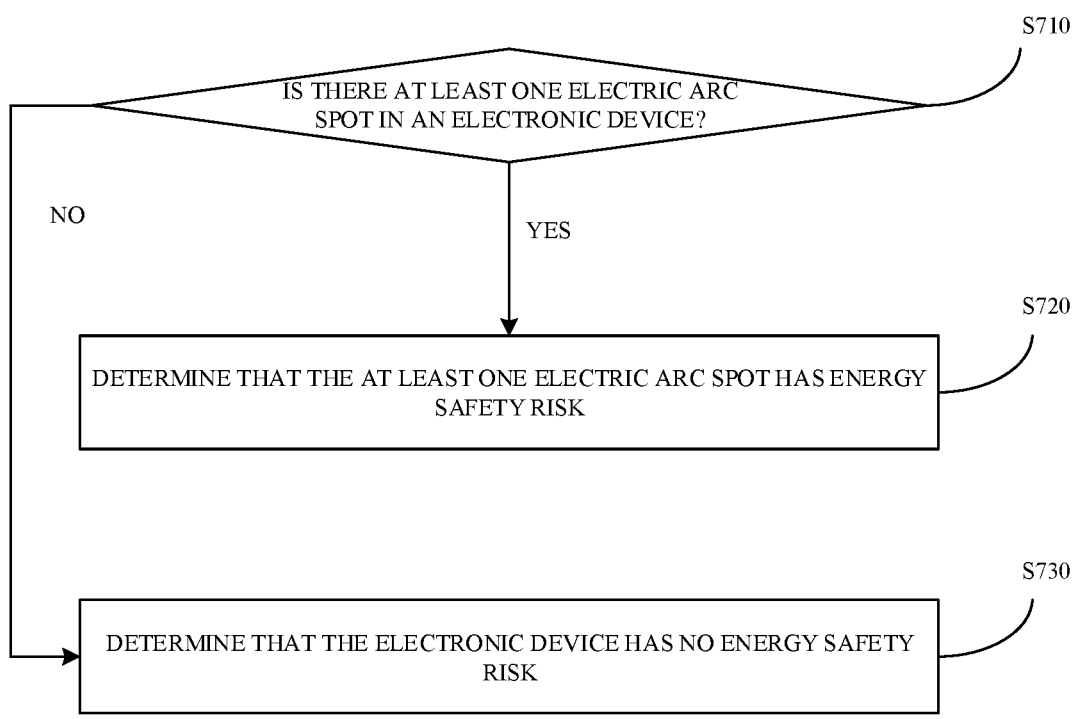
FIG. 7 is a flowchart of a method for fault verification of an electronic device according to other implementations.

FIG. 7 is a flowchart of a method for fault verification of an electronic device according to other implementations.

According to implementations, the safety risk further includes energy safety risk.

It is to be noted that, the energy safety risk refers to multiple times of arc inside the electronic device which result in excessively high energy at a spot of arc and may even push away a protective casing of the electronic device.

Generally, besides a normal current path (that is, a path for current), the electronic device is further provided with a protective circuit. However, the protective circuit can only be subjected to arc once. When the protective circuit has been subjected to arc multiple times (such as an arc for the second time), the protective circuit can no longer work, which in turn leads to the energy safety risk and thus results in smoking, white spots, charring, etc. at a location where arc occurs multiple times.

The difference between the method illustrated in FIG. 7 and the method in the foregoing implementations lies in that the method illustrated in FIG. 7 further includes the following.

At block S710, determine existence of at least one electric arc spot in the electronic device. If any electric arc spot exists in the electronic device, proceed to operations at block S720. Otherwise, proceed to operations at block S730.

As an example, a casing of the power adaptor which has been subjected to high-voltage fault simulation can be opened or removed, to determine whether secondary electric arc has occurred on PCBA (printed circuit board+assembly, that is, PCB on which components or devices are installed) due to material failure in devices. If secondary electric arc has occurred, determine that a secondary electric arc spot (where white smoke or white spots exist and can be observed directly) has the energy safety risk.

As another example, whether the at least one electric arc spot exists in the electronic device can be determined through image recognition.

For instance, an interior image of the power adaptor prior to high-voltage fault simulation can be collected with an image sensor, and then an interior image of the power adaptor which has been subjected to high-voltage fault simulation can be collected. The above two images collected are compared to determine whether there is any electric arc spot in the electronic device. Alternatively, the interior image of the power adaptor which has been subjected to high-voltage fault simulation can be directly collected to determine, through image recognition, whether there is any electric arc spot in the electronic device.

At block S720, determine that the at least one electric arc spot has the energy safety risk.

At block S730, determine that the electronic device has no energy safety risk.

In other implementations, a non-transitory computer readable storage medium is provided. The non-transitory computer readable storage medium storing programs which, when executed by a computer, are operable with the computer to: control a power supply to apply a first power-supply voltage to an electronic device until a device to-be-verified of the electronic device satisfies a material-failure condition; control the power supply to apply a second power-supply voltage to the electronic device to determine whether the electronic device has safety risk according to at least one of: temperature distribution information, existence of electric arc, or existence of accumulation of electrolyte between a primary coil and a secondary coil of a transformer of the electronic device.

The local overheat spot refers to a local area of the electronic device where a temperature remains higher than a threshold temperature for a third preset duration or the temperature increases to be higher than the threshold temperature within a fourth preset duration, the second preset duration is longer than the third preset duration, and the third preset duration is longer than the fourth preset duration.

The power supply and the electronic device can be the one illustrated in FIG. 1A and FIG. 1B.

In the method for fault verification of an electronic device provided herein, material failure in devices due to high voltage (such as 380V or even higher) is simulated, to determine whether the material failure in devices will result in safety risk. As such, an intermediate state of devices which is common in the electronic device or chain failure caused by device failure can be verified, thereby ensuring that safety risk of a product can be found in advance.

Through the description of the above implementations, those skilled in the art can easily understand that the example implementations described herein can be implemented by software, or by software in combination with necessary hardware. Therefore, the technical solution according to implementations may be embodied in the form of a software product, which may be stored in a non-volatile storage medium (which may be a CD-ROM, a USB electric arc disk, a mobile hard disk, etc.) or on a network and includes several instructions to cause a computing device (which may be a personal computer, a server, or a network device, etc.) to execute the method according to implementations.

In addition, the structures, proportions, sizes, etc. illustrated in the accompanying drawings are only intended for matching the contents disclosed in the description for those skilled in the art to understand and read, rather than limiting the conditions of implementations, and therefore do not have any technical significance. Any structural modification, change in proportional relationship, or adjustment in size should fall within the scope covered by the technical content disclosed in implementations without affecting the technical effect and the purpose of implementations.

What is claimed is:

1. A method for fault verification of an electronic device, the electronic device comprising a device to-be-verified, and the method comprising:
    applying a first power-supply voltage to the electronic device until the device to-be-verified satisfies a material-failure condition; and
    applying a second power-supply voltage to the electronic device to determine whether the electronic device has safety risk, wherein the first power-supply voltage is higher than the second power-supply voltage, and the safety risk is caused by material failure in the device to-be-verified.

2. The method of claim 1, wherein the safety risk comprises at least one of: risk of casing melting, risk of electrical leakage, or energy safety risk.

3. The method of claim 2, wherein the electronic device further comprises a protective casing, the safety risk is the risk of casing melting, and applying the second power-supply voltage to the electronic device to determine whether the electronic device has the safety risk comprises:
    coupling electrically the electronic device with a load;
    applying, within a first preset duration which has elapsed after the device to-be-verified satisfies the material-failure condition, the second power-supply voltage to the electronic device to make the electronic device work normally for a second preset duration, wherein the first preset duration is shorter than the second preset duration;
    obtaining temperature distribution information of the electronic device; and
    determining, according to the temperature distribution information, whether the electronic device has the risk of casing melting.

4. The method of claim 3, wherein determining, according to the temperature distribution information, whether the electronic device has the risk of casing melting comprises:
    determining, according to the temperature distribution information, existence of at least one local overheat spot in the electronic device; and
    determining that the at least one local overheat spot has the risk of casing melting upon determining that the at least one overheat spot exists in the electronic device.

5. The method of claim 4, wherein the local overheat spot refers to a local area of the electronic device where a temperature remains higher than a threshold temperature for a third preset duration or the temperature increases to be higher than the threshold temperature within a fourth preset duration, wherein
    the second preset duration is longer than the third preset duration, and the third preset duration is longer than the fourth preset duration.

6. The method of claim 5, wherein the threshold temperature is associated with a melting point of the protective casing.

7. The method of claim 2, wherein the device to-be-verified comprises a capacitor, and the material-failure condition is that electrolyte in the capacitor is ejected out.

8. The method of claim 7, wherein the electronic device further comprises a transformer, the transformer comprises a primary coil and a secondary coil, the safety risk is the risk of electrical leakage, and the method further comprises:
    determining existence of at least one electrolyte accumulation spot between the primary coil and the secondary coil;
    detecting a touch current between the primary coil and the secondary coil upon determining that the at least one electrolyte accumulation spot exists between the primary coil and the secondary coil; and
    determining that the electronic device has the risk of electrical leakage in response to the touch current being larger than a threshold current.

9. The method of claim 2, further comprising:
    determining existence of at least one arc spot in the electronic device; and determining that the at least one arc spot has the energy safety risk upon determining that the at least one arc spot exists in the electronic device.

10. The method of claim 9, wherein determining the existence of at least one arc spot in the electronic device comprises:
    determining existence of at least one arc spot in the electronic device via image recognition on at least one interior image of the electronic device.

11. The method of claim 1, wherein the device to-be-verified comprises a fuse, and the material-failure condition is that conductive substances in the fuse are ejected out.

12. A system for fault verification of an electronic device, comprising:
    an electronic device comprising a device to-be-verified;
    a power supply electrically coupled with the electronic device; and
    a controller coupled with the electronic device and the power supply and configured to:
        control the power supply to apply a first power-supply voltage to the electronic device until the device to-be-verified satisfies a material-failure condition; and
        control the power supply to apply a second power-supply voltage to the electronic device to determine whether the electronic device has safety risk, wherein the first power-supply voltage is higher than the second power-supply voltage, and the safety risk is caused by material failure in the device to-be-verified.

13. The system of claim 12, wherein the electronic device further comprises a protective casing,
    the controller configured to control the power supply to apply the second power-supply voltage is configured to:
        control the power supply to apply, within a first preset duration which has elapsed after the device to-be-verified satisfies the material-failure condition, the second power-supply voltage to the electronic device to make the electronic device work normally for a second preset duration, wherein the first preset duration is shorter than the second preset duration; and
    the controller is further configured to:
        obtain temperature distribution information of the electronic device; and
        determine, according to the temperature distribution information, whether the electronic device has the safety risk, wherein the safety risk comprises risk of casing melting.

14. The system of claim 13, wherein the controller configured to determine, according to the temperature distribution information, whether the electronic device has the safety risk, wherein the safety risk comprises the risk of casing melting is configured to:
    determine, according to the temperature distribution information, existence of at least one local overheat spot in the electronic device; and
    determine that the at least one local overheat spot has the risk of casing melting upon determining that the at least one overheat spot exists in the electronic device, wherein
    the local overheat spot refers to a local area of the electronic device where a temperature remains higher than a threshold temperature for a third preset duration or the temperature increases to be higher than the threshold temperature within a fourth preset duration,
    the second preset duration is longer than the third preset duration, and the third preset duration is longer than the fourth preset duration.

15. The system of claim 12, wherein the device to-be-verified comprises a capacitor, the material-failure condition is that electrolyte in the capacitor is ejected out, the electronic device further comprises a transformer, and the transformer comprises a primary coil and a secondary coil, the controller is further configured to:
    determine existence of at least one electrolyte accumulation spot between the primary coil and the secondary coil;
    detect a touch current between the primary coil and the secondary coil upon determining that the at least one electrolyte accumulation spot exists between the primary coil and the secondary coil; and
    determine that the electronic device has the safety risk in response to the touch current being larger than a threshold current, wherein the safety risk refers to electrical leakage.

16. The system of claim 12, wherein the controller is further configured to:
    determine existence of at least one arc spot in the electronic device; and
    determine that the at least one arc spot has the safety risk upon determining that the at least one arc spot exists in the electronic device, wherein the safety risk refers to energy safety.

17. The system of claim 12, further comprising:
    a load configured to be electrically coupled with the electronic device when the power supply applies the second power-supply voltage to the electronic device.

18. The system of claim 12, the device to-be-verified comprises a fuse, and the material-failure condition is that conductive substances in the fuse are ejected out.

19. A non-transitory computer readable storage medium storing programs which, when executed by a computer, are operable with the computer to:
    control a power supply to apply a first power-supply voltage to an electronic device until a device to-be-verified of the electronic device satisfies a material-failure condition; and
    control the power supply to apply a second power-supply voltage to the electronic device to determine whether the electronic device has safety risk according to at least one of: temperature distribution information, existence of electric arc, or existence of accumulation of electrolyte between a primary coil and a secondary coil of a transformer of the electronic device, wherein
    the first power-supply voltage is higher than the second power-supply voltage, and the safety risk is caused by material failure in the device to-be-verified.

20. The non-transitory computer readable storage medium of claim 19, wherein the programs operable with the computer to control the power supply to apply the second power-supply voltage to the electronic device to determine whether the electronic device has safety risk are operable with the computer to:
    enable electrical connection between the electronic device and a load;
    control the power supply to apply, within a first preset duration which has elapsed after the device to-be-verified satisfies the material-failure condition, the second power-supply voltage to the electronic device to make the electronic device work normally for a second preset duration, wherein the first preset duration is shorter than the second preset duration;

obtain temperature distribution information of the electronic device; and determine that the electronic device has the safety risk upon determining, according to the temperature distribution information, that at least one overheat spot exists in the electronic device.

\* \* \* \* \*